(12) United States Patent
Park

(10) Patent No.: US 7,906,842 B2
(45) Date of Patent: Mar. 15, 2011

(54) WAFER LEVEL SYSTEM IN PACKAGE AND FABRICATION METHOD THEREOF

(75) Inventor: Yun Mook Park, Cheongju-Si (KR)

(73) Assignee: NEPES Corporation, Chungbuk (KR)

( * ) Notice: Subject to any disclaimer, the term of this patent is extended or adjusted under 35 U.S.C. 154(b) by 300 days.

(21) Appl. No.: 11/828,741

(22) Filed: Jul. 26, 2007

(65) Prior Publication Data

US 2008/0290496 A1 Nov. 27, 2008

(30) Foreign Application Priority Data

May 25, 2007 (KR) .................. 10-2007-0050661

(51) Int. Cl.
*H01L 23/12* (2006.01)

(52) U.S. Cl. . 257/700; 257/725; 257/693; 257/E23.062; 257/E23.063; 438/202; 361/783

(58) Field of Classification Search .................. 257/99, 257/177–181, 584, 625, 675, 688, 689, 705, 257/707, 712–722, 796, 706, 700, 725, E23.062, 257/E23.063, E23.169, E23.173; 361/720, 361/783; 438/202; 174/52.2
See application file for complete search history.

(56) References Cited

U.S. PATENT DOCUMENTS

| | | | |
|---|---|---|---|
| 6,201,266 B1* | 3/2001 | Ohuchi et al. ............... 257/106 |
| 6,205,028 B1* | 3/2001 | Matsumura ................. 361/720 |
| 6,350,952 B1* | 2/2002 | Gaku et al. .................... 174/522 |
| 2002/0149102 A1* | 10/2002 | Hashemi et al. .............. 257/706 |
| 2003/0200654 A1* | 10/2003 | Omote et al. ................... 29/852 |
| 2004/0021218 A1* | 2/2004 | Hayama et al. ............... 257/700 |
| 2004/0033654 A1* | 2/2004 | Yamagata ..................... 438/202 |
| 2004/0125579 A1* | 7/2004 | Konishi et al. ................ 361/783 |
| 2005/0151240 A1* | 7/2005 | Takeda et al. ................. 257/700 |
| 2006/0214288 A1* | 9/2006 | Ohsumi ....................... 257/724 |

\* cited by examiner

*Primary Examiner* — Matthew E Warren
*Assistant Examiner* — Fang-Xing Jiang
(74) *Attorney, Agent, or Firm* — Hosoon Lee

(57) ABSTRACT

There is provided a system-in-package (SiP), which includes a substrate obtained by cutting a wafer for each unit system; one or more first electronic devices mounted on the substrate by a heat radiation plate; a plurality of interlayer dielectrics sequentially formed on the substrate; and one or more second electronic devices buried between or in the interlayer dielectrics on the substrate. A heat sink may be additionally attached to the bottom surface of the substrate. In this case, a thermal conduction path including heat pipes connecting the heat radiation plate on the substrate and the heat sink is formed. In the SiP, various types of devices are buried at a wafer level, so that a more integrated semiconductor device is implemented corresponding to demand for a fine pitch. Further, the heat radiation of a device required in high-speed operation and high heat generation is maximized due to the multi-stepped heat radiation structure, and thus the operation of the device is more stabilized.

15 Claims, 14 Drawing Sheets

330

100'

330

WAFER LEVEL SYSTEM IN PACKAGE AND FABRICATION METHOD THEREOF

BACKGROUND OF THE INVENTION

1. Technical Field

The present invention relates to a system-in-package (SIP) and a fabrication method thereof, and more particularly, to a stack-type package wherein a plurality of electronic devices are buried or stacked on a substrate such as a wafer.

2. Discussion of Related Art

Integration technology for semiconductor devices on a substrate has been continuously developed in order to reduce the size of a system and increase the integration density of semiconductor devices. A system-on-chip (SoC) has been introduced, in which a large number of circuit components are integrated on one chip. However, the SoC, which is configured by stacking various circuits on one single chip, has a technical limit in enhancing circuit integration. Recently, various stack-type structures, such as system-in-package (SiP), system-on-package (SoP), package-on-package (PoP), multi chip package (MCP) and the like, have been suggested as alternatives to overcome the technical limitation of system integration.

Recently, MCP technology of stacking a plurality of memory chips into one package realized a high-capacity package by fabricating even 16-stack memories. While the MCP technology is about stacking only memories, the SiP, SoP, PoP and the like are fabricated by Integrating memories and non-memories such as system LSI, ASIC, passive device and so on. In the SiP, SoP, PoP and the like, respective layers having various functions are stacked together or are connected to one another from side to side. In the SiP, a plurality of circuits configured as individual chips are connected to one another from side to side such that they are mounted as one package.

Studies on integrated packages such as the MCP, SiP and the like have been rapidly conducted at home and abroad. As requirements of high-performance and thin portable communication devices are increased, demands on the market for state-of-the-art integrated packages are increased. Particularly, as requirements of small, multi-functional and slim application products, such as mobile phones, PDAs, DSCs and the like, are increased, attempts have been actively made to bury passive and active devices in a package substrate or main board.

In a conventional integrated package, a buried stack structure is fabricated through a sequential build-up method of laminating an insulating material such as resin on a package substrate or main board, forming a hole in the package substrate or main board such that a device can be buried in the hole, burying an active or passive device in the formed hole, and then forming an interlayer dielectric on the insulating material.

However, since burying and stacking processes are performed on a package substrate or main board in the package by the burying and build-up method, there is a limit in reducing the size of a device corresponding to a fine pitch. Further, since a redistribution process for electrical connection between embedded chips should be essentially added due to the limit of a fine pitch to be applied, time for processing and fabrication cost are increased.

Furthermore, when a semiconductor device for high-speed operation, and the like are embedded in a package, a problem of heat radiation, etc. are inevitably raised. However, since there is a limit in solving the problems due to its structural feature, it is difficult to stably operate the device.

SUMMARY OF THE INVENTION

An aspect of the present invention provides an integrated package having a new structure, in which various kinds of electronic devices can be easily integrated.

Another aspect of the present invention provides a new system-in-package (SiP), in which a wafer level process can be performed.

Another aspect of the present invention provides an SiP, in which heat can be easily radiated, and signals can be smoothly processed in high-speed operation.

Other objects and features of the present invention will be more fully disclosed in the following detailed description.

Exemplary embodiments of the present invention provide an SiP which includes a substrate obtained by cutting a wafer for each unit system; one or more first electronic devices mounted on the substrate by a heat radiation plate; a plurality of interlayer dielectrics sequentially formed on the substrate; and one or more second electronic devices buried between or in the interlayer dielectrics on the substrate.

A heat sink may be additionally attached beneath the substrate. Preferably, heat pipes for connecting the heat radiation plate on the substrate and the heat sink are formed to pass through the substrate. The first electronic device may include a device operated in high speed and generating high heat, such as CPU, MCU, AP or BBP. The second electronic device may include an ASIC or LSI device having relatively little heat radiation.

The SiP of the present invention may further include a passive device buried between or in the interlayer dielectrics. The passive device may be an integrated passive device buried in the interlayer dielectrics or a thin film type passive device such as inductor or capacitor. The SiP of the present invention may further include a redistribution conductive layer electrically connected to at least one of the first and second electronic devices. A vertical conductive layer may be formed in the interlayer dielectrics to electrically connect the first or second electronic device.

The SiP may be mounted on an external substrate (e.g., a printed circuit board) by forming a solder bump electrically connected to the first and second electronic devices on the substrate.

Other embodiments of the present invention provide an SiP which includes a substrate obtained by cutting a wafer for each unit system; one or more first electronic devices mounted on the substrate by a heat radiation plate; a plurality of interlayer dielectrics sequentially formed on the substrate; one or more second electronic devices buried between or in the interlayer dielectrics on the substrate; and a thermal conduction path connecting the second electronic device to the heat radiation plate.

Other embodiments of the present invention provide a fabrication method of an SiP, which includes positioning a heat radiation plate on a wafer level substrate; mounting a first electronic device on the heat radiation plate; forming a plurality of interlayer dielectrics on the substrate; burying a second electronic device between or in the interlayer dielectrics; and forming a solder bump on the substrate.

Other embodiments of the present invention provide a fabrication method of an SiP, which includes positioning a heat radiation plate on a wafer level substrate; mounting a first electronic device on the heat radiation plate; forming a plurality of interlayer dielectrics on the substrate; burying a second electronic device between or in the interlayer dielectrics; forming a solder bump on the substrate; removing the substrate; and attaching a heat sink to the bottom surface of the heat radiation plate.

In the present invention, active and passive devices constituting a system may be buried at a wafer level. Particularly, active devices required in high-speed operation and high heat generation, such as a CPU, a micro controller unit (MCU), an AP and a base band processor (BBP), are positioned on a heat radiation plate, while the other active devices and passive devices are buried through a sequential stacking method. Since passive devices may be formed to be buried or to have the shape of a thin film, a degree of freedom in the integration of whole devices is very high.

According to the present invention, since various kinds of devices are buried at a wafer level as compared to a technology for burying devices in a package substrate or printed circuit board, a more integrated semiconductor device can be implemented corresponding to demand for a fine pitch. Further, the heat radiation of devices required in high-speed operation and high heat generation is maximized by virtue of the multi-stepped heat radiation structure, and the operations of the devices are more stabilized. The heat radiation structure can be implemented with a single heat sink, a heat sink connected to heat pipes, or a complex structure including a heat radiation plate, heat pipes and a heat sink.

Since an infrastructure implemented under a conventional wafer level process can be used in an integrated semiconductor package having such a complex structure, costs for initial equipment investment can be minimized.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention. Like numbers refer to like element.

Figure 1:
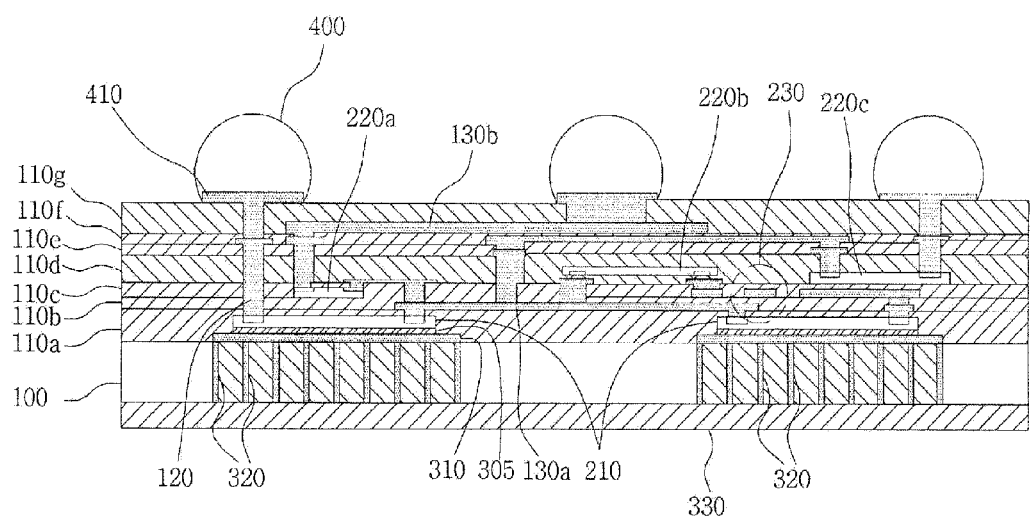
FIG. 1 is a cross-sectional view of a system-in-package (SiP) according to an embodiment of the present invention.

FIG. 1 illustrates a cross-sectional view of a system-in-package (SiP) according to an embodiment of the present invention.

The SiP includes a plurality of active devices such as a microprocessor and the like on a substrate 100 obtained by cutting a wafer for each unit system. The active devices may be mounted directly on the top surface of the substrate 100 by a bonding member, or may be buried between multi-layered interlayer dielectrics.

A passive device may be buried together with the various active devices. The passive device may be formed in the shape of a thin film through a wafer level thin film process. The number of various devices buried or formed in the shape of a thin film is not limited. Although not shown in this figure, a memory and the like may be stacked together with the active devices.

Electronic devices 210 operated in high speed and generating high-temperature heat are mounted on the substrate 100 by a bonding member 305, e.g., a die attach film (DAF). The electronic device 210 may be an integrated semiconductor device. Specifically, the electronic device 210 may include a microprocessor and the like. A heat radiation plate 310 is interposed between the lower side of the electronic device 210 and the substrate 100 such that high heat generated during the operation of the electronic device 210 can be rapidly radiated to the outside.

Heat pipes 320 passing through the substrate 100 in a thickness direction thereof and having a metal or alloy with superior thermal conductivity filled in the heat pipes 320 are formed in the substrate 100. Accordingly, heat conducted through the heat radiation plate 310 can be rapidly transferred to the outside through the heat pipes 320.

A heat sink 330 is additionally attached beneath the substrate 100, and thus heat radiated from the electronic devices 210 is effectively diffused by a thermal conduction path from the heat radiation plate 310 to the heat sink 330 via the heat pipes 320 in the substrate 100.

A plurality of interlayer dielectrics 110a, 110b, 110c, 110d, 110e, 110f and 110g are sequentially formed on the top surface of the substrate 100. A plurality of electronic devices 220a, 220b and 220c are buried between or in the interlayer dielectrics. The buried electronic devices 220a, 220b and 220c may include integrated semiconductor devices having relatively less heat radiation than the aforementioned electronic devices 210 mounted on the substrate 100.

The SiP of the present invention may further include a passive device between or in the interlayer dielectrics. The passive device may be formed by burying an integrated passive device in an insulating layer or by forming an inductor or capacitor in the shape of a thin film 230.

The SiP according to the present invention may include redistribution conductive layers 130a and 130b for electrically connecting two bonding pads (or electrode terminals) arranged at different positions to each other, as well as bonding pads and electric interconnections for electrical connections of the mounted electronic devices 210, the buried electronic devices 220a, 220b and 220c, and the like. Each of the redistribution conductive layers 130a and 130b may be electrically connected between electrode terminals of the electronic devices or even to an electrode terminal exposed to the outside of the electronic devices. A vertical conductive layer 120 may be formed in the interlayer dielectrics to be electrically connected between the electronic devices or to an electrode terminal exposed to the outside of the electronic devices. The vertical conductive layer 120 may be formed by making a hole passing through the plurality of stacked interlayer dielectrics and then filling a conductive material in the hole.

The SiP according to the present invention may further include one or more solder bumps 400 as electrode terminals exposed to the outside of the SiP at the top portion thereof. The solder bump 400 may further include a lower metal layer 410 formed beneath the solder bump 400 so as to improve an electrical characteristic and to enhance adhesion strength and oxidation resistance. The various types of electronic devices in the SiP may be electrically connected to an external substrate (e.g., a printed circuit board) through the solder bumps 400. In addition, the SiP of the present invention may be stacked on another SiP via the solder bumps 400. Thus, the SiP according to the present invention may be effectively stacked with another type of a stack package, thereby to constitute a multi-layered package or integrated package.

Hereinafter, a fabrication method of an SiP according to an embodiment of the present invention will be described. It will be readily understood by those skilled in the art that the following fabrication method is intended to assist the understanding of the technical teachings of the present invention, and process sequence or the kind and number of sequentially-stacked layers is not intended to limit the scope of the invention.

Figure 2:
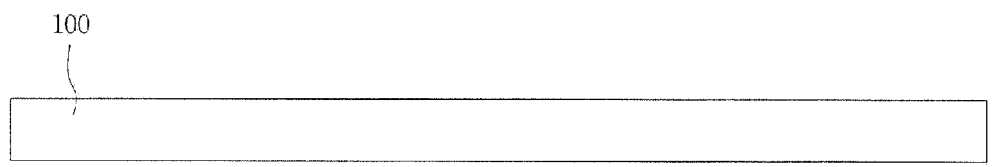
FIGS. 2 through 21 are cross-sectional views illustrating fabrication processes of an SiP according to an embodiment of the present invention.

First, a substrate 100 having the shape of a wafer is prepared (FIG. 2). The substrate 100 may include a hard single-crystalline substrate, such as a silicon substrate, used in a typical semiconductor fabrication process. In addition, the substrate 100 may include another substrate made of $Al_2O_3$, glass or metal, which can be used in a wafer level process. As will be described later, a flexible film may be laminated on the surface of a hard substrate, various types of electronic devices are then mounted and buried using the hard substrate as a temporary substrate, and the temporary substrate is finally removed, thereby fabricating a slimmer SiP.

Figure 3:
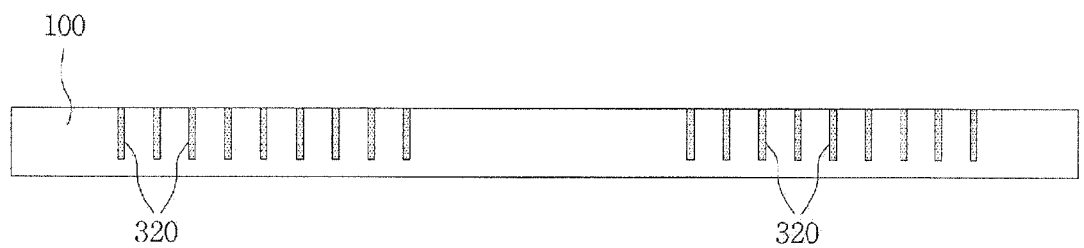

A plurality of holes are formed in the prepared substrate 100, and heat pipes 320 are formed by filling a thermal conductive material in the holes (FIG. 3). The holes for forming the heat pipes 320 may be formed as through holes passing through the substrate 100 in a thickness direction thereof. However, the holes may be partially formed in the substrate 100 in a vertical direction thereof, and then ends of the holes may be made to be exposed by reducing the thickness of the substrate 100 through subsequent backgrinding.

Figure 4:
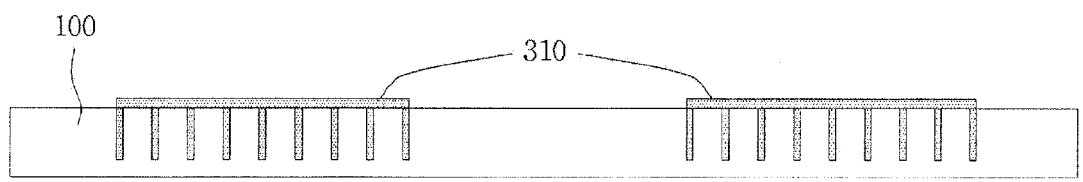

Heat radiation plates 310 are positioned on the substrate 100 having the heat pipes 320 (FIG. 4). The heat radiation plate 310 may use, for example, a thermal interface material (TIM) such as a thermal conductive compound, a phase change material, a gap filler or a thermal tape.

Figure 5:
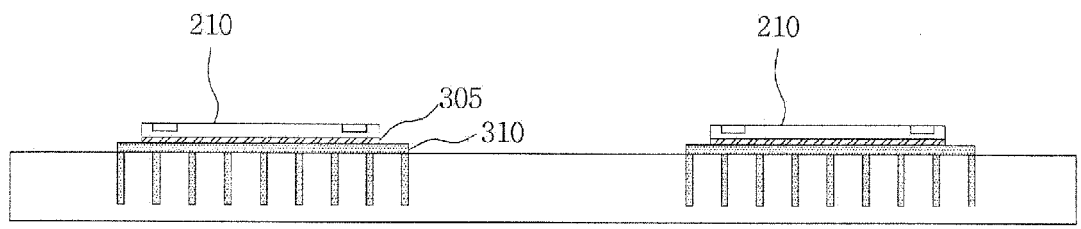

After forming a thermal conduction path passing through the substrate 100 by the heat radiation plate 310 and the heat pipes 320, a high heat-generating electronic device 210 in need of heat radiation is mounted on the heat radiation plate 310 (FIG. 5). The high heat-generating electronic device 210 may include a microprocessor required in high-speed operation, and the like. Heat generated in an operation of the high heat-generating electronic device 210 is discharged to the bottom of the substrate 100 via the heat radiation plate 310 and the heat pipes 320.

The high heat-generating electronic device 210 may be seated on the substrate 100, and the position of the high heat-generating electronic device 210 may be then fixed by forming a subsequent insulating layer. However, the high heat-generating electronic device 210 may be adhered to the surface of the heat radiation plate 310 by an adhesive member 305.

Figure 6:
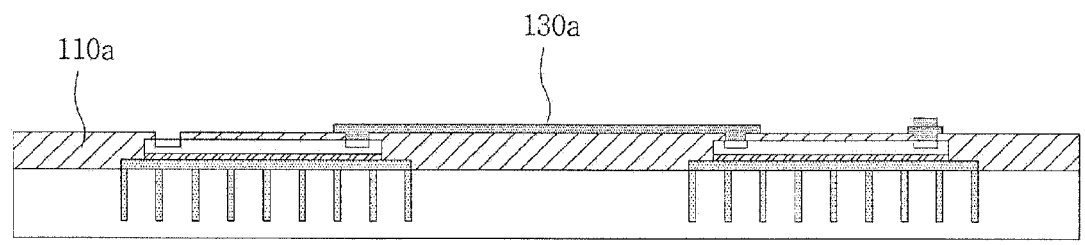

After forming the high heat-generating electronic device 210, an insulating layer 110a is formed on the substrate 100 such that openings are partially exposed, and a conductive pattern 130a is then formed through the openings (FIG. 6).

The insulating layer 110a and other interlayer dielectrics to be described later may be dielectric layers formed through a thin film process or high polymer resin layers.

Figure 7:
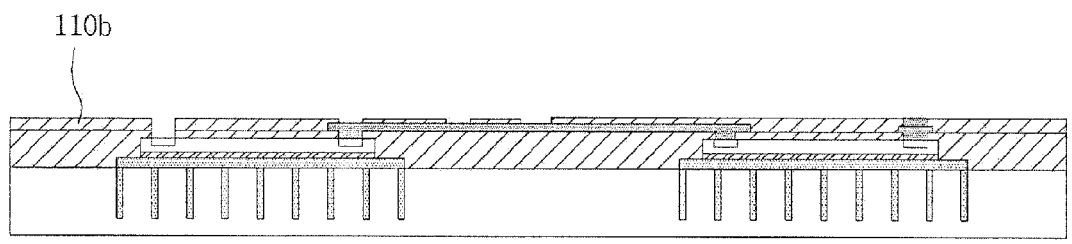
Figure 8:
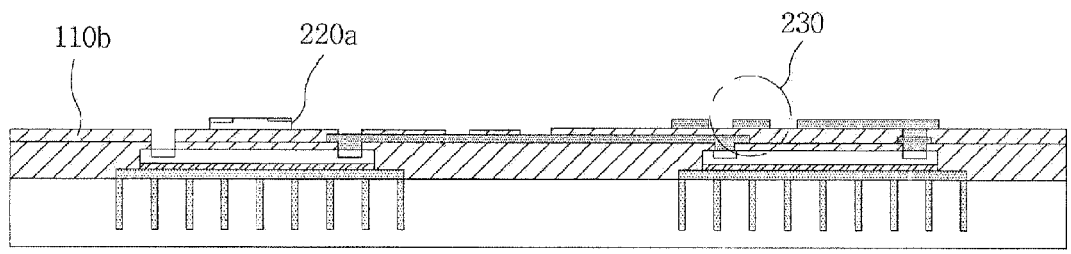
Figure 9:
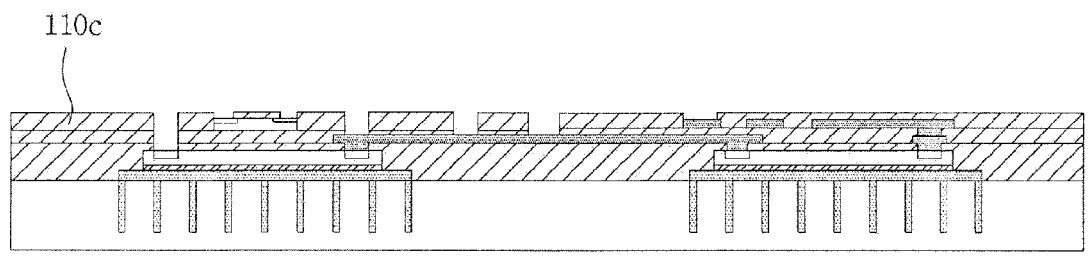

Subsequent electronic devices may be formed through a sequential build-up method. Another insulating layer 110b is formed to cover the conductive pattern 130a (FIG. 7), and another electronic device 220a is then positioned on the insulating layer 110b (FIG. 8). In this case, the electronic device 220a may be buried by forming an insulating layer 110c to be thick and then forming a buried region in a predetermined depth as shown in the cross-sectional view of FIG. 9. The buried electronic device 220a may be an active device or integrated passive device.

A passive device 230 may be formed through a thin film process while burying the electronic device 220a. The passive device may be an inductor or capacitor. The position and number of passive devices is not specifically limited.

Figure 10:
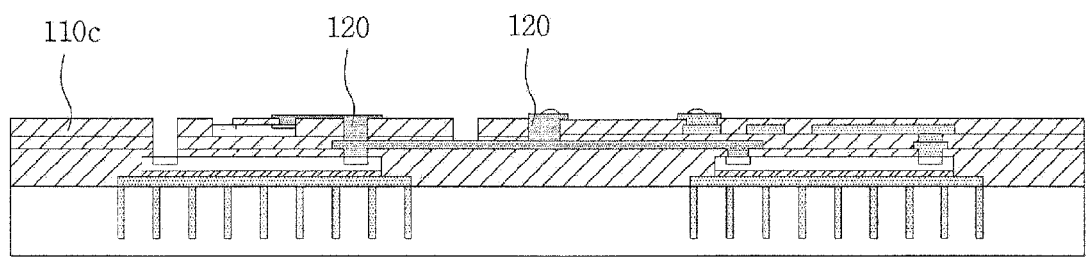

In the process of burying the electronic device 220a or forming the thin film type passive device 230, the insulating layer 110c may be partially etched such that openings are partially exposed, and vertical conductive layers 120, electrode terminals, interconnections between electrodes and the like may be then formed (FIG. 10).

Figure 11:
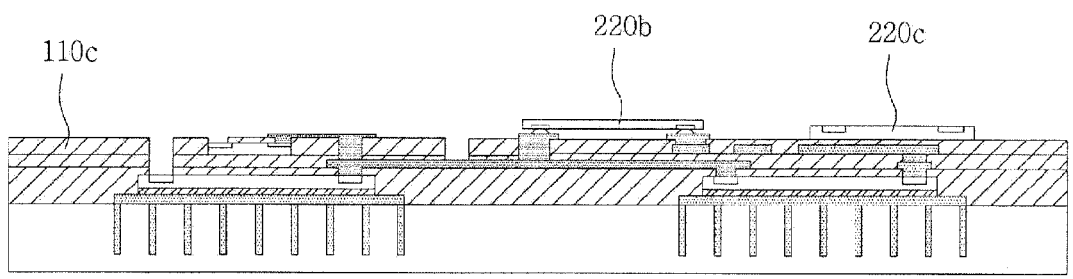

As shown in FIG. 11, an electronic device may be mounted or buried by the sequential build-up method to have its top surface facing up 220c or facing down 220b.

Figure 12:
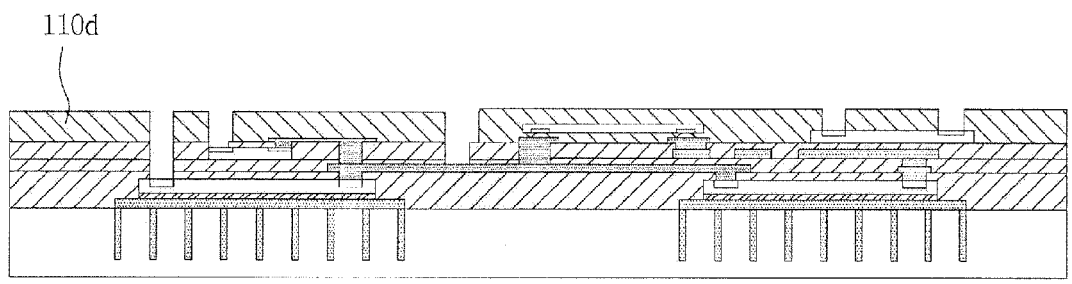

An interlayer dielectric 110d is formed on the buried electronic devices to be insulated from each other (FIG. 12).

Figure 13:
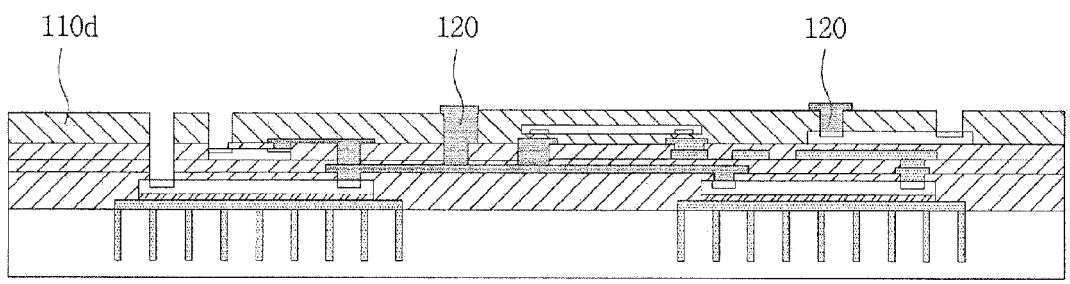
Figure 14:
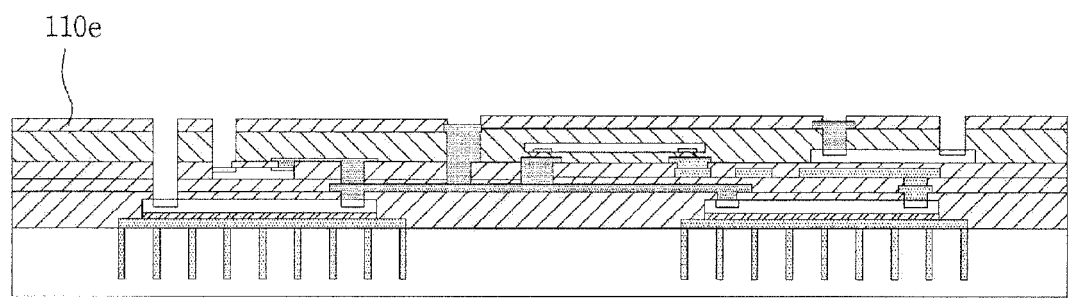
Figure 15:
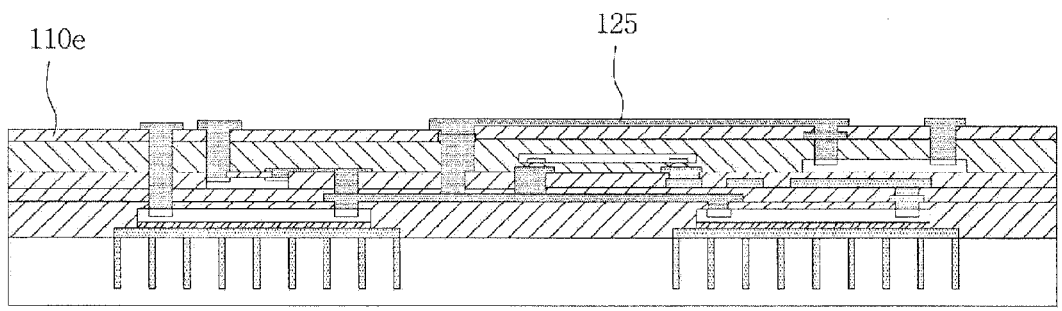

Vertical conductive layers 120 are formed such that the buried electronic devices are connected to each other (FIG. 13). Another insulating layer 110e is formed such that the electrode devices are electrically connected to an external circuit (FIG. 14). A conductive pattern 125 is formed on the insulating layer 110e (FIG. 15). A vertical conductive layer vertically passing through the multi-layered insulating layer is formed.

Figure 16:
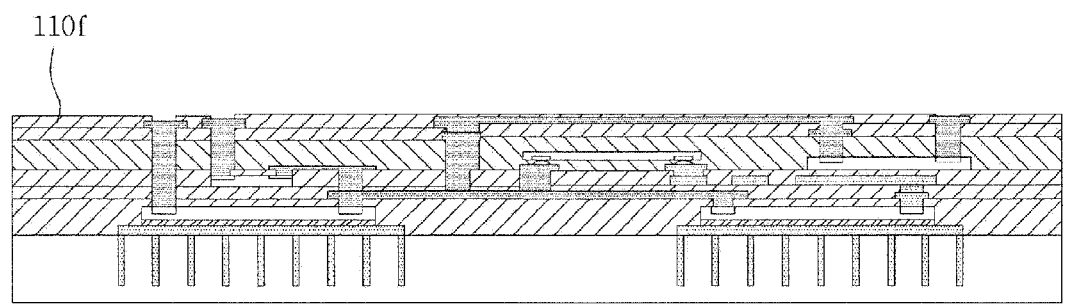
Figure 17:
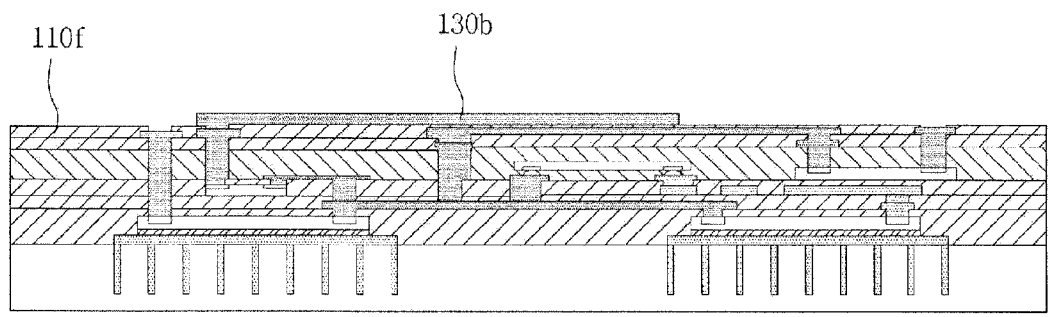

Vertical conductive layers or conductive patterns (or redistribution conductive layers) formed to extend to another position from an electrode terminal of an electrode device may be formed as many as desired number in an appropriate process regardless of process sequence. Thus, an insulating layer 110f may be further formed (FIG. 16), and a redistribution conductive layer 130b for electrically connecting the partially-exposed conductive layers may be additionally formed (FIG. 17). Particularly, the redistribution conductive layer 130b is used to arrange solder bumps at a uniform interval regardless of the position of the buried electrode device.

Figure 18:
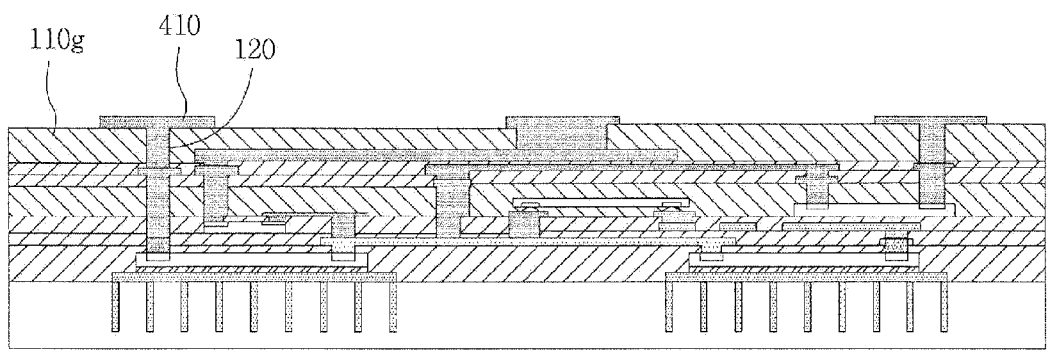
Figure 19:
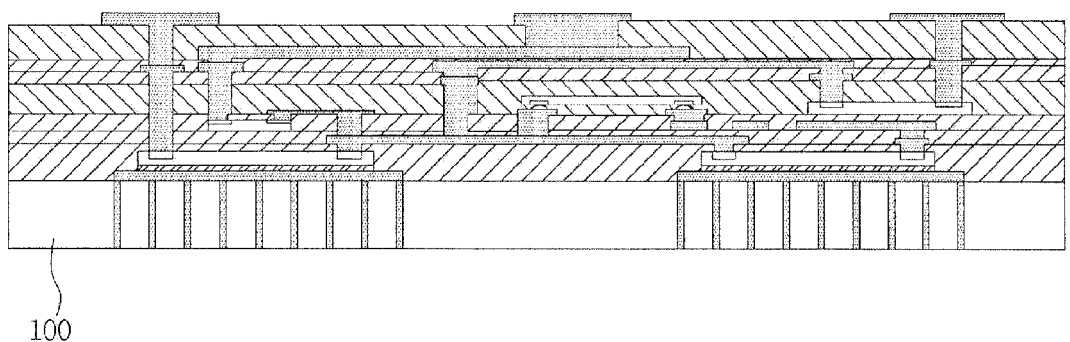

Electrode terminals exposed at the surface of an insulating layer 110g and lower metal layers 410 in a solder bump forming region are formed such that the buried electrode device can be electrically connected to an external circuit (FIG. 18). The thickness of the substrate 100 is reduced by grinding the bottom surface thereof, and the heat pipes 320 passing through the substrate 100 are exposed from the bottom surface thereof (FIG. 19).

Figure 20:
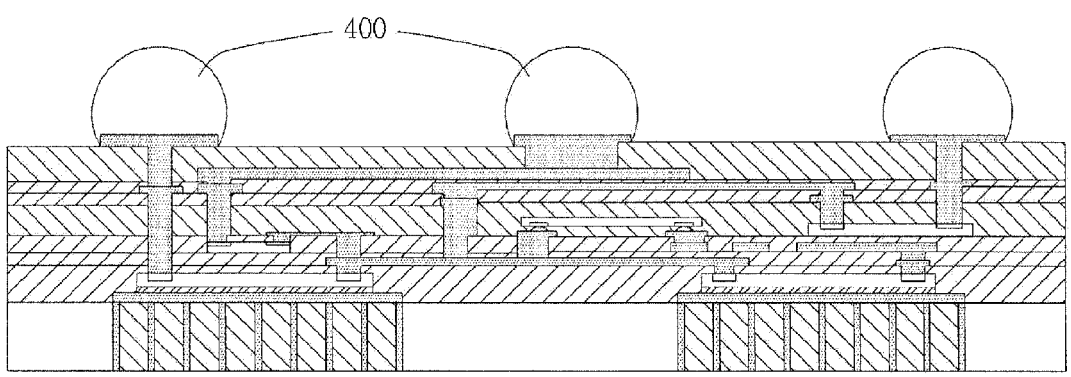
Figure 21:
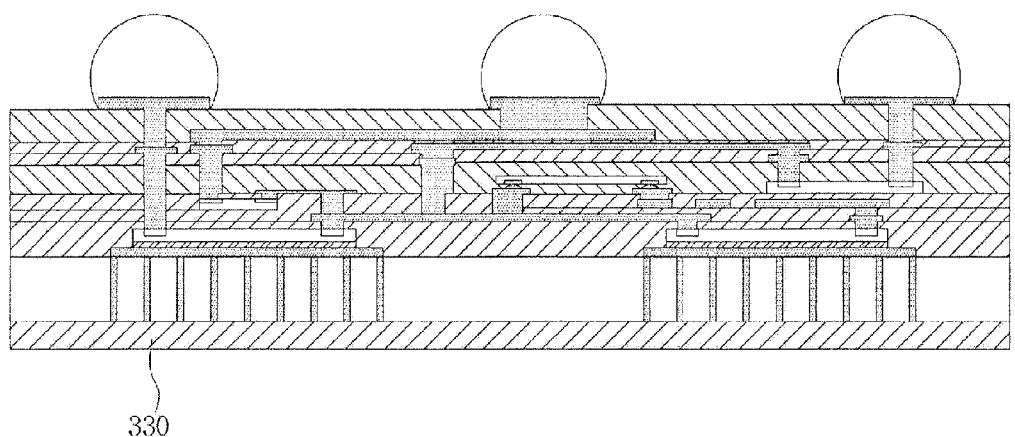

After that, a solder bump 400 is formed on the top surface of the lower metal layer 410 (FIG. 20), and a heat sink 330 is adhered to the bottom surface of the substrate 100 (FIG. 21).

In the aforementioned fabrication process, the order of the grinding the substrate 100, the forming the solder bump 400, the adhering the heat sink 330 and the like is not limited but may be varied depending on an environment of the package fabrication.

Meanwhile, another conductive contact element (e.g., a conductive wire) in addition to the solder bump may be formed on the package. Although not shown in this figure, the buried electronic device may include a memory. A memory may be vertically positioned with respect to an electronic device laid on the package not in the package, or a plurality of memories may be positioned to be parallel with one another.

Figure 22:
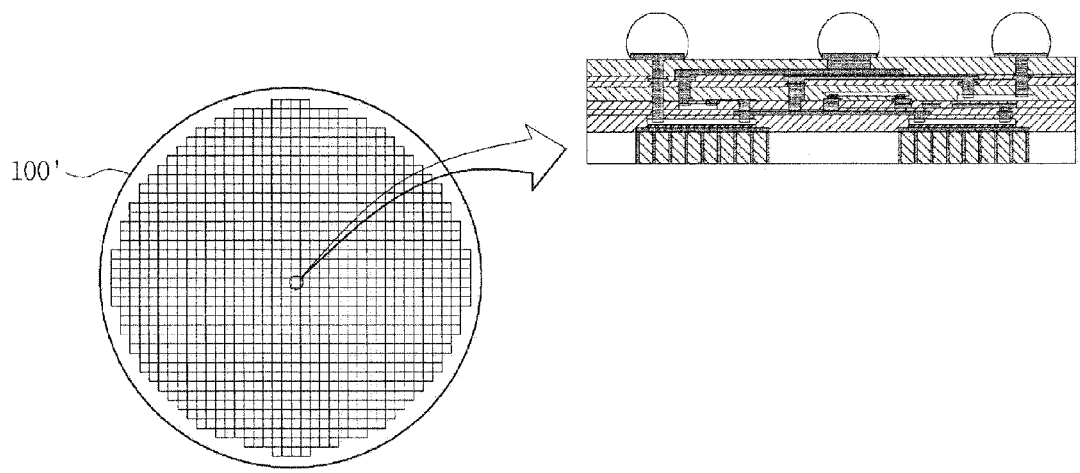
FIG. 22 is a schematic view illustrating an SiP fabricated at a wafer level.

The SiP according to the present invention may be fabricated at a wafer level through a thin film process or the like. As shown in FIG. 22, a wafer 100', which is finally made out in fabrication, may be cut in the unit of individual system (or individual package) to be used for application products.

The SiP according to the present invention can implement an integrated package being much thinner and slimmer by removing the substrate.

Figure 23:
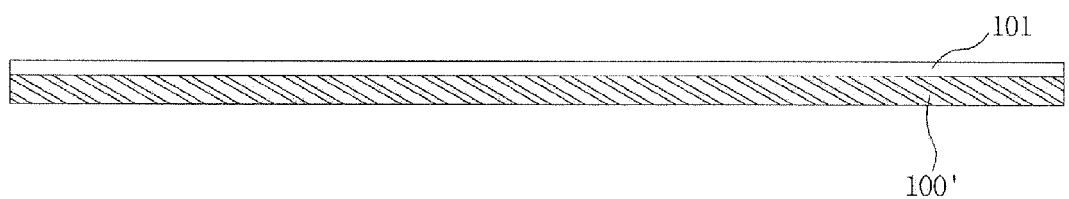
FIGS. 23 through 26 are cross-sectional views illustrating fabrication processes of an SiP according to another embodiment of the present invention.

Referring to FIG. 23, a hard substrate 100' may be used as a temporary substrate for fabrication of a package, by laminating a thin and flexible film 101 on the hard substrate 100'. The flexible film 101 may use a thin film having a release property, a release agent coated in liquid phase, or the like.

Figure 24:
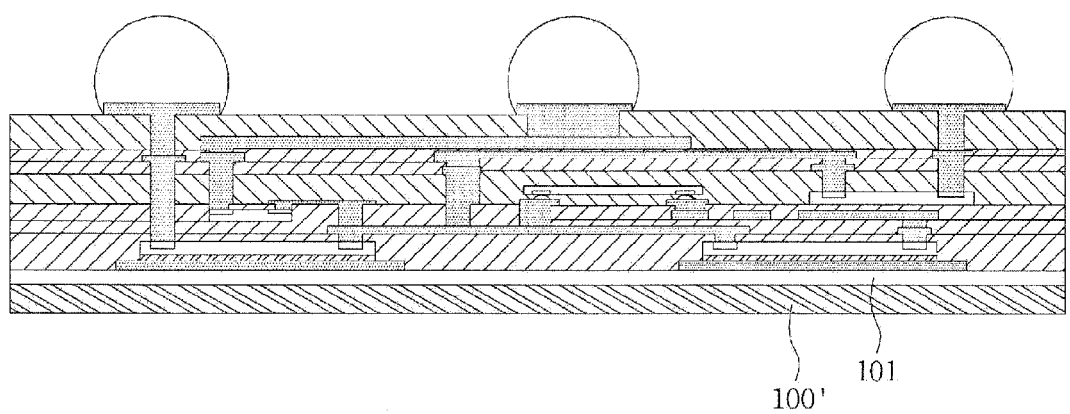
Figure 25:
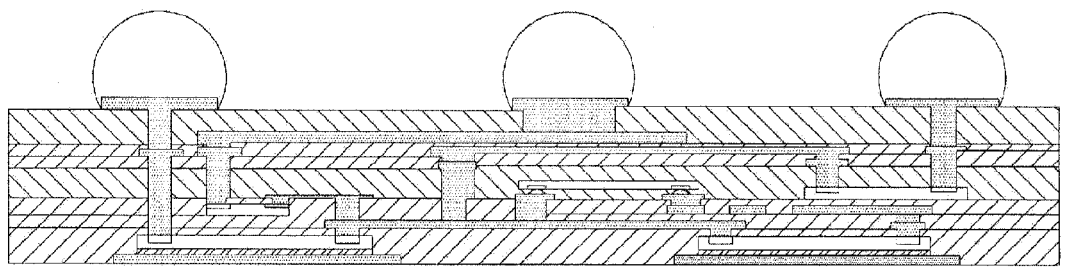
Figure 26:
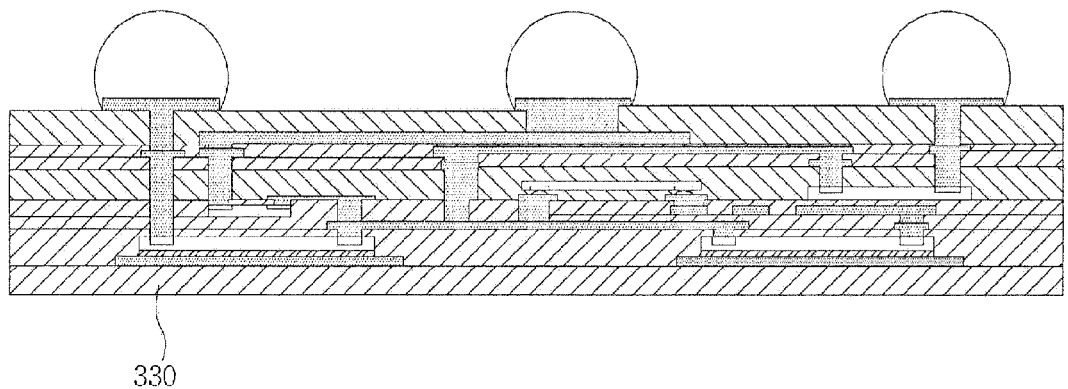

As shown in FIG. 24, various types of electronic devices are mounted or buried using a substrate having a complex structure in which the flexible film 101 is formed on the hard base substrate 100'. After stacking or burying the electronic devices and forming solder bumps, the temporary substrate is removed as shown in FIG. 25. A heat sink 330 is additionally attached to the bottom surface of the package such that heat radiation can be maximized (FIG. 26). The substrate is removed from the package in such a manner, so that the package can be slimmer to contribute to miniaturization of various electronic products, and the heat radiation efficiency of the package can be enhanced.

Meanwhile, according to the SiP of the present invention, the heat radiation of other electronic devices buried in a package can be effectively controlled as well as the heat radiation of an electronic device mounted on a heat radiation plate on the top surface of a substrate.

Figure 27:
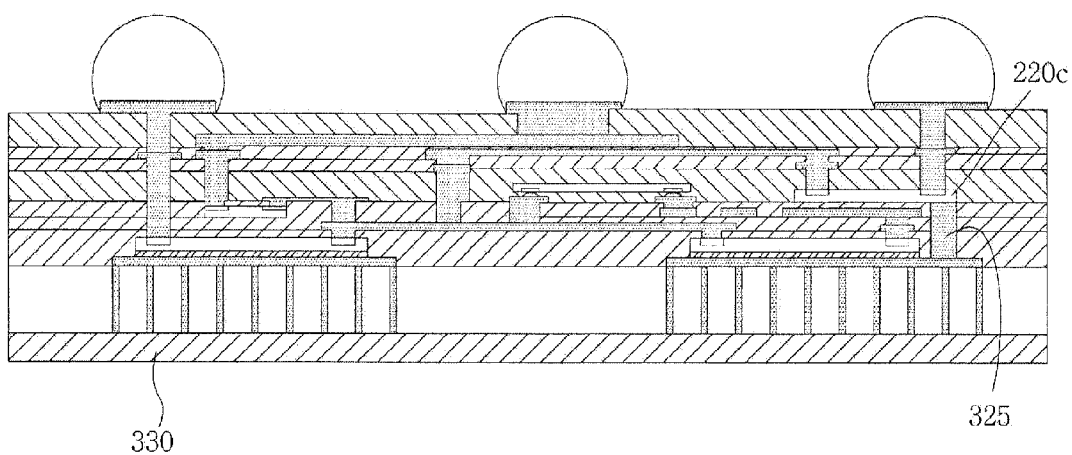
FIG. 27 is a cross-sectional view of an SiP according to another embodiment of the present invention.

Referring to FIG. 27, in a plurality of electronic devices mounted or buried on a substrate obtained by cutting a wafer for each unit system, a portion of a buried electronic device 220c is connected to a heat radiation plate on the substrate through a thermal conduction path 325.

Such a thermal conduction path may be formed by making a hole vertically passing through interlayer dielectrics and connecting a heat radiation plate and an electronic device buried in the package, and filling a thermal conductive material in the hole. Thus, heat can be radiated to the outside of the electronic device buried in the package through the thermal conduction path 325. Similarly, a heat radiation plate comes into contact with a portion of a buried electronic device, and the heat radiation plate is connected to another thermal conduction path, so that heat can be effectively radiated to the outside.

In the present invention, a wafer level substrate and a wafer level process are used in fabricating an SiP in which memories, logic circuits, other electric devices and the like are integrated in one package. Accordingly, a fine pitch can be easily implemented in a fabrication process of the SiP, and a light, slim and compact integrated package can be provided. Since the total size of the package is reduced, the lengths of electric interconnections in the package are reduced, so that a time delay/distortion generated in a high-frequency operation can be prevented.

According to the present invention, a light, slim and compact SiP operated in high capacity, high performance and high speed can be implemented. A single system can be implemented by integrating a plurality of electronic devices, memories and various types of passive devices in a package. Further, a wafer level substrate is used as a substrate for an SiP, so that a fine pitch can be implemented. The length of an interconnection between logic and passive devices can be reduced using a thin film process, and thus electrical characteristics of the system can be improved. Furthermore, a fabrication method of an integrated package is simplified, mass production is possible, and a passive device is formed in the shape of a thin film on a substrate, so that a light, slim and compact integrated package can provided. In addition, a heat radiation plate, a heat pipe, a heat sink or the like are attached on the lower side of a high heat-generating device in devices constituting the system, so that the devices and the system can be prevented from being deteriorated, and thus the total lifespan of the package can be increased.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A system-in-package (SiP) comprising:
   a substrate obtained by cutting a wafer for each unit system;
   a heat radiation plate formed on the substrate;
   a first electronic device mounted on the heat radiation plate;
   a first dielectric layer on the substrate and the first electronic device;
   a first conductive pattern electrically connected to the first electronic device;
   a second dielectric layer on the first conductive pattern;
   one or more second electronic devices and passive devices buried between or in the second dielectric layer, said second electronic devices and said passive devices being placed above the first electronic devices;
   a third dielectric layer on the second electronic devices and passive devices;
   a second conductive pattern on the third dielectric layer and electrically connected to the second electronic device;
   a fourth dielectric layer on the second conductive pattern;
   solder bumps on the fourth dielectric layer;
   a first vertical conductive layer passing through the dielectric layers and electrically connected between the first and second conductive patterns;
   a second vertical conductive layer passing through the dielectric layers and electrically connected between the first electronic device and one of the solder bumps;
   a heat sink attached beneath the substrate;
   heat pipes formed to pass through the substrate and connecting the heat radiation plate on the substrate and the heat sink to each other; and
   a die attach film being placed between the first electronic device and the heat radiation plate.

2. The SiP according to claim 1, wherein the first electronic device comprises a device operated in high speed and generating high heat, such as CPU, MCU, AP or BBP.

3. The SiP according to claim 1, wherein the passive device comprises an integrated passive device or a thin film type passive device.

4. The SiP according to claim 1, wherein a lower metal layer having one or more layers is formed beneath the solder bump.

5. The SiP according to claim 1, wherein the first or second electronic device is mounted to have a top surface facing up or down.

6. The SiP according to claim 1, wherein the substrate is made of a Si, $Al_2O_3$, glass or metal material.

7. The SiP according to claim 1, further comprising
a thermal conduction path connecting the second electronic device to the heat radiation plate.

8. The SiP according to claim 1, wherein the thermal conduction path is configured to connect the second electronic device to the heat radiation plate by filling a thermal conductive material in a hole vertically passing through the interlayer dielectrics.

9. The SiP according to claim 1, wherein the heat pipes are filled with a metal or alloy.

10. The SiP according to claim 1, wherein the heat radiation plate comprises a phase change material.

11. The SiP according to claim 1, wherein the heat radiation plate comprises a thermal tape.

12. The SiP according to claim 1, wherein the heat radiation plate comprises a gap filler.

13. The SIP according to claim 1, wherein the second vertical conductive layers are extended vertically from a lower metal layer, on which the solder bumps are formed.

14. The SIP according to claim 13, wherein the second vertical conductive layers are extended vertically from a center region of the lower metal layer.

15. The SIP according to claim 13, wherein the second vertical conductive layers directly contact a bonding pad of the first electronic device.

* * * * *